United States Patent [19]

Person

[11] Patent Number: 5,132,615

[45] Date of Patent: Jul. 21, 1992

[54] DETECTING PRESENCE OF N+ DIFFUSION FAULTS IN A MICROPACKAGE CONTAINING A PLURALITY OF INTEGRATED CIRCUITS BY ANALYZING $V_{ref}$ CURRENT

[75] Inventor: George A. Person, Phoenix, Ariz.

[73] Assignee: Honeywell Bull Inc., Billerica, Mass.

[21] Appl. No.: 630,102

[22] Filed: Dec. 19, 1990

[51] Int. Cl.$^5$ ............................................. G01R 31/28
[52] U.S. Cl. ................................. 324/158 R; 371/22.1; 371/25.1
[58] Field of Search .......................... 324/158 R, 73.1; 371/22.1, 21.3, 25.1, 27

[56] References Cited

U.S. PATENT DOCUMENTS

| | | | |
|---|---|---|---|
| 4,631,724 | 12/1986 | Shimizu | 371/27 |
| 4,637,020 | 1/1987 | Schnabeck | 371/25.1 |
| 4,710,704 | 12/1987 | Ando | 371/25.1 |
| 4,820,974 | 4/1989 | Katsura et al. | 371/21.3 |

Primary Examiner—Ernest F. Karlsen
Attorney, Agent, or Firm—J. S. Solakian; J. H. Phillips

[57] ABSTRACT

In order to determine if a micropackage containing a plurality of integrated circuits, at least some of which are supplied with a reference voltage, should be classified as "risky" the reference voltage current is measured for each micropackage in a group of logically identical micropackages. The measurements are arranged for statistical analysis, and an initial threshold is selected above which a micropackage is classified as "risky". The subsequent history in operation of measured micropackages, as well as reference voltage measurements on additional newly fabricated like micropackages, is entered into the database to permit refining the position of the threshold. In one variant, all micropackages in an initially measured group are "passed".

5 Claims, 2 Drawing Sheets

DETECTING PRESENCE OF N+ DIFFUSION FAULTS IN A MICROPACKAGE CONTAINING A PLURALITY OF INTEGRATED CIRCUITS BY ANALYZING $V_{ref}$ CURRENT

FIELD OF THE INVENTION

This invention relates to the art of testing electronic integrated circuitry and, more particularly, to testing micropackages containing many integrated circuits without the necessity of opening the micropackage.

BACKGROUND OF THE INVENTION

One technique employed in packaging the electronic circuitry of digital computers, particularly in large scale computer systems, is the use of micropackages, each of which contains a large number of integrated circuits interconnected to perform a given function, the micropackages, in turn, being appropriately interconnected. Each micropackage, of course, is subjected to a regimen of functional tests before it is incorporated into a computer system. Nonetheless, even when these functional tests (and other tests) have been successfully passed, a given micropackage may still later fail in operation, and the failure may be of the elusive "intermittent" type or even a singular failure) which may seem to have no apparent cause other than the possibility of the disruption caused by a stray alpha particle or some other purely transient condition which is not the "fault" of the micropackage. However, it is possible that the fault does, indeed, lie within the micropackage itself despite its successful completion of numerous tests and subsequent "good" record of operation in the field. For example, in current-mode logic or emitter coupled logic, it is possible that one or more integrated circuits in a given micropackage may have in its structure an undetected N+ diffusion "pipe" or "spike" which subtly alters the operating characteristics of the specific transistor in the integrated circuit and may subject it to long term deterioration (often without complete failure) in performance.

N+ diffusion pipes are faults in the base extending from emitter to collector of an integrated circuit transistor as a thin plane. Spikes are similar base faults which do not completely connect the emitter and collector. In general, any such fault will increase the number of recombination sites which decreases minority carrier lifetime. As a result, recombination current in the base region increases which increases base current leading to a decrease in $\beta$ (i.e., current gain: $I_c/I_b$). Other, related deleterious effects may arise as a result of the presence of N+ diffusion faults in an integrated circuit.

Thus, it is to the detection of the presence of N+ diffusion faults in a micropackage and to the use of such information in analyzing the "risk" level of a given micropackage to which the present invention is directed.

OBJECTS OF THE INVENTION

It is therefore a broad object of this invention to detect the presence of a subtle fault within one or more integrated circuits of a micropackage in order to determine if the micropackage is "good" or "risky".

It is a more specific object of this invention to detect the presence of N+ diffusion faults within one or more integrated circuits of a micropackage.

It is a still more specific object of this invention to indirectly detect the presence of N+ diffusion faults within one or more integrated circuits of a micropackage by analyzing a reference current.

In another aspect, it is an object of this invention to detect the presence of N+ diffusion faults in a micropackage without the necessity to de-lid the micropackage.

SUMMARY OF THE INVENTION

Briefly, these and other objects of the invention are achieved by measuring the reference voltage current for each micropackage in a group of logically identical micropackages. The measurements are then arranged for statistical analysis, and an initial threshold is selected above which a micropackage is classified as "risky". The subsequent history in operation of measured micropackages, as well as reference voltage measurements on additional newly fabricated like micropackages, is subsequently entered into the database to permit refining the position of the threshold. In one variant, all micropackages in an initially measured group are "passed"; i.e., the initial threshold is established just above the highest reference voltage current observed in the group of like micropackages.

DESCRIPTION OF THE DRAWING

The subject matter of the invention is particularly pointed out and distinctly claimed in the concluding portion of the specification. The invention, however, both as to organization and method of operation, may best be understood by reference to the following description taken in conjunction with the subjoined claims and the accompanying drawing of which:

DESCRIPTION OF THE PREFERRED EMBODIMENT(S)

Figure 1:
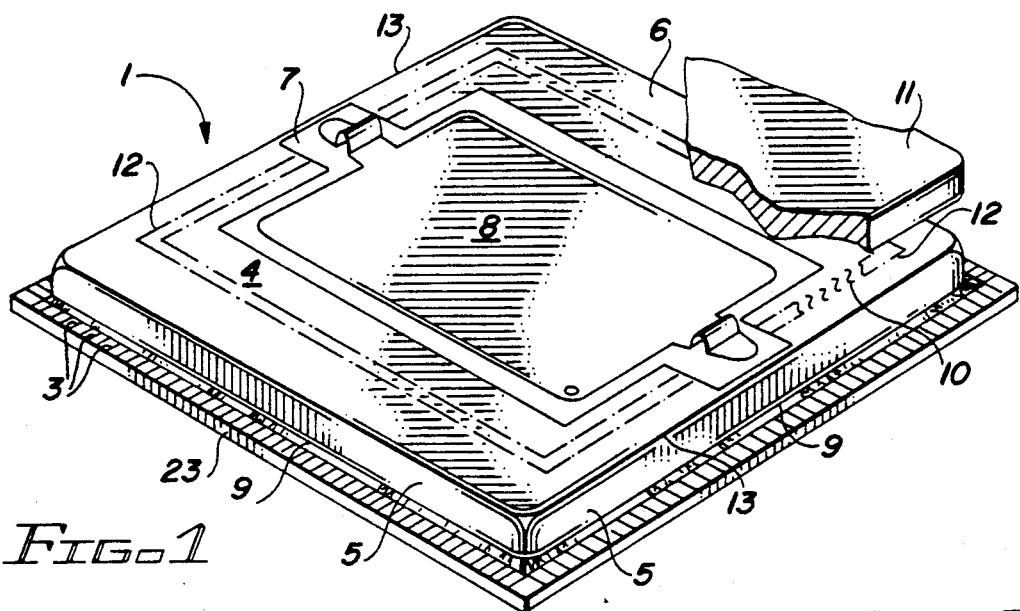
FIG. 1 is a three-quarter view of a typical micropack in which the invention finds exemplary use.

FIG. 1 illustrates an exemplary electronics package or micropackage 1 in which the invention finds particular use. The micropackage 1 contains a very extensive amount of integrated circuitry on and within a multilayer printed circuit board 2 which carries a large number of signal contact pads 3 about its periphery. Because of the quantity of electronic circuitry contained in the module 1, substantial d-c supply power must be provided to the module even when the circuitry employed is especially selected for its low current requirements. Merely by way of example, in an exemplary electronics module 1 using a $V_{cc}$ of $-3.6$ volts, the d-c current requirement may be on the order of 10 amperes. Those skilled in the art will appreciate that a power requirement of this level cannot be supplied to the electronics circuitry through the contact pads 3 since the signal traces within the multilayer circuit board 2 are very fine; they simply cannot carry the concentrated current required.

Rather, power is supplied to the module 1 through a conductive cover member 4 which also serves to seal the circuitry contained within the package 1 against environmental contamination. The conductive cover member 4 has downwardly extending risers 5 on all four sides (with their adjoining edges welded or otherwise sealed) and a conductive upper surface 6. An insulating pad 7 underlays a generally centrally disposed conductive pad 8. The cover member 4 is affixed to the circuit board 2 around the entire length of the bottom edges of the risers 5 at a peripheral solder trace 9 which is disposed just inboard the signal contact pads 3. The peripheral solder trace 9 serves as the ground return electrode for the entire circuitry disposed within the module 1. Thus, during normal operation, the module ground return current is introduced in a distributed manner along all or a given section of the peripheral length of the bottom edges of the risers 5, flows upwardly through the risers and into the conductive upper surface to seek the return pads to the power supply. In the exemplary micropackage 1 shown in FIG. 1, ground return current is fed to two opposing sides of the four structure sides, and this characteristic is taken into account in the examples of practicing the method set out below.

Power at the $V_{cc}$ potential is provided to the module 1 through the centrally disposed conductive pad 8 which is appropriately coupled to large solder pads (not shown) on the upper surface of the circuit board 2 through apertures and structure (not shown) well known to those skilled in the art.

Figure 2:
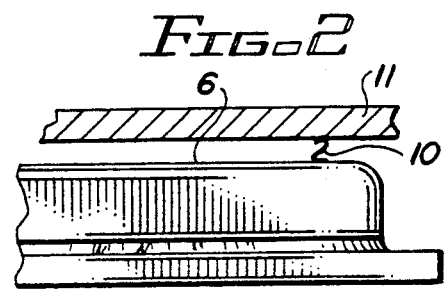
FIG. 2 is a partial side view of the micropack shown in FIG. 1.

Coupling of the electronics package 1 to the source of power on the ground side is obtained through a large number (such as 64) of spring loaded contacts 10. Referring briefly also to FIG. 2, each spring loaded contact 10 is permanently affixed to a system ground bus 11 and bears at its other end against the conductive upper surface 6 when the electronics package 1 is in its operative position within the electronics system. The positions at which the contacts 10 abut the conductive upper surface 6 is along an imaginary line 12 somewhat set back from the corner edges 13 at which the risers 5 join the conductive upper surface 6.

In some integrated circuit logic families, such as CML (current-mode logic), which are suitable for micropackage implementation, a reference voltage, $V_{ref}$, is applied to the base of a certain transistor in each logic element of each integrated circuit. $V_{ref}$, in such logic families, must be closely regulated to a narrow voltage range in order for the circuitry to operate correctly. In a micropackage, $V_{ref}$ is supplied via one or more of the contact pads 3. Thus, $V_{ref}$ is available for analysis during a micropackage test procedure. However, it will be understood that the invention does not simply comprehend measurement of $V_{ref}$ against a range for a given type of micropackage. Rather, an analysis of the current ($I_{ref}$) flowing in the summation of the $V_{ref}$ circuits for such a micropackage is undertaken.

Figure 3:
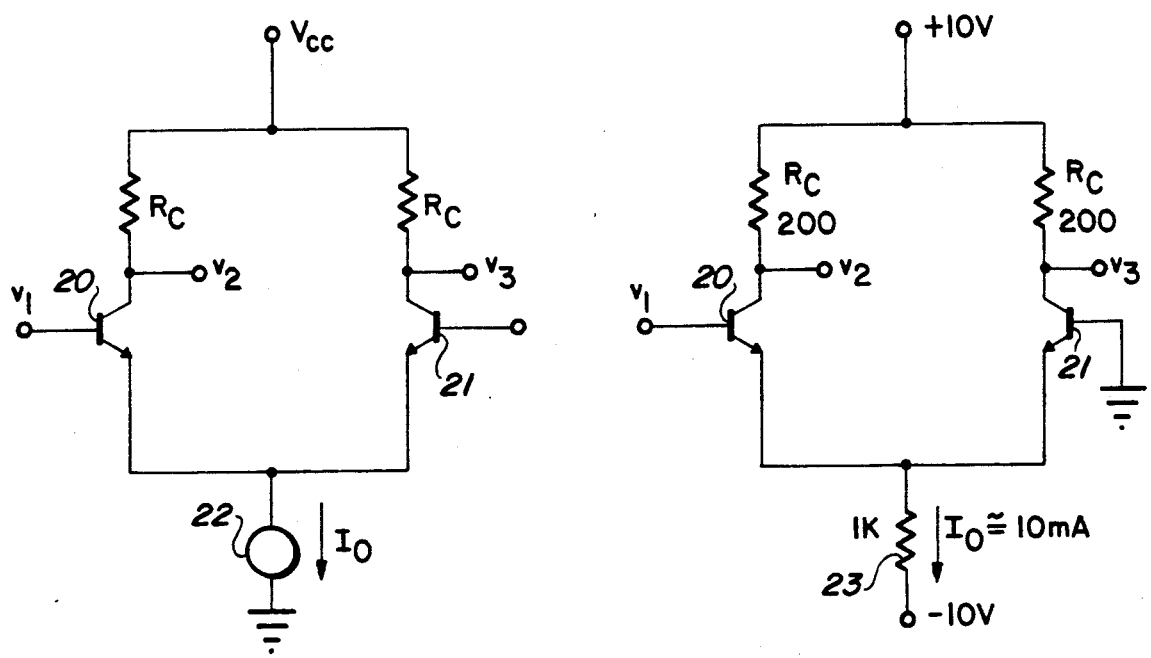
FIG. 3 is an analytical representation of a current-mode mode logic "building block"

FIG. 3 shows an analytical elementary circuit constituting a basic current-mode logic (CML) "building block". As is well known in the art, it is generally impossible to design non-saturating switching circuits in which saturation is avoided by controlling the base current. The current gain B varies from unit to unit far too much to permit accurate control of the "on" state collector current by this means. On the other hand, the collector current can be controlled, thereby preventing saturation, by designing the switching circuit so that the emitter current in the "on" state is carefully controlled and is essentially independent of the base drive. Circuits that use this design philosophy are called current-mode logic, often configured with a special emitter follower output circuit in which it is sometimes designated as emitter-coupled logic (ECL).

In the circuit shown in FIG. 3, the NPN transistors 20 and 21 are configured as a difference amplifier with the base of transistor 21 being biased by $V_{ref}$. The fixed current $I_o$ provided by the current source 22 divides between the two transistors in a manner determined by the input voltage $v_1$. If $v_1$ is less than $V_{ref}$, transistor 20 is cut off, and essentially all of $I_o$ flows in transistor 21. The circuit is then in the "off" state, and the output voltage $v_2$ is equal to the supply voltage $V_{cc}$. As the input voltage increases, the transistor 20 begins to conduct, and the current $I_o$ divides between the two transistors. When $v_1$ exceeds $V_{ref}$ by a small margin, the emitter diode of transistor 21 is reverse biased, and all of $I_o$ flows in transistor 20. This is the "on" state of the circuit in which the output voltage is $V_{cc} - R_c I_o$. Thus, the fixed current $I_o$ is "steered" to either transistor by the input voltage $v_1$. The range of input voltage over which the transition from "off" to "on" occurs is quite narrow; voltage changes of only a few tenths of a volt suffice to steer the current from one transistor to the other. It will be noted that the circuit has two complementary outputs ($v_2$ and $v_1$) and another input, if desired, at the base of transistor 21. Consequently, this basic building block can be used either as in inverter or as a non-inverting amplifier.

Figure 4:
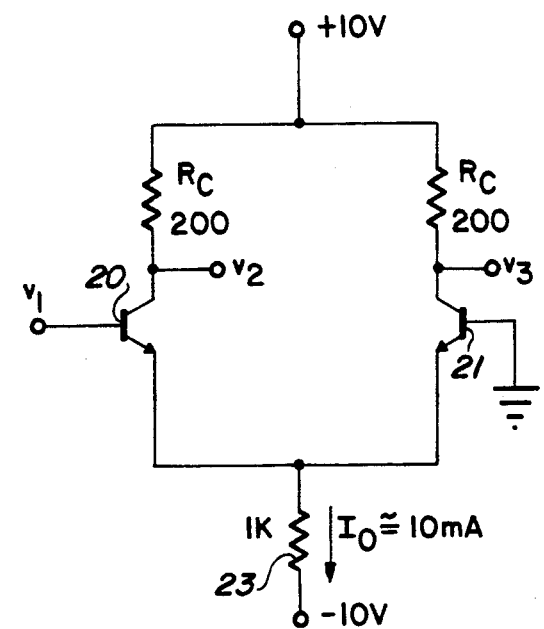
FIG. 4 is a schematic diagram of a current-mode logic "building block"

In practice, the current source 22 of FIG. 3 is replaced by a resistor 23 and a negative voltage source as shown in FIG. 4. ($V_{ref}$ in this example is ground potential.) This modification causes the static transfer characteristic to have a small negative slope in the region corresponding to the "on" state. In this configuration, the input to the base of transistor 20 may shift, for example, between +1 volt (logic "1") and −1 volt (logic "0"), and the output, taken at the collector of transistor 21 (i.e., $v_3$) will shift between about +10 volts (circuit at logic "1") and +8 volts (circuit at logic "0"). This illustrates one inconvenient aspect of CML circuits: the voltage levels that correspond to the binary values of the output variable are shifted from the voltage levels at the input. Consequently, CML circuits cannot be directly cascaded, but well known techniques have been developed to overcome this characteristic, and CML/ECL logic is widely used in high speed logic applications.

Figure 5:
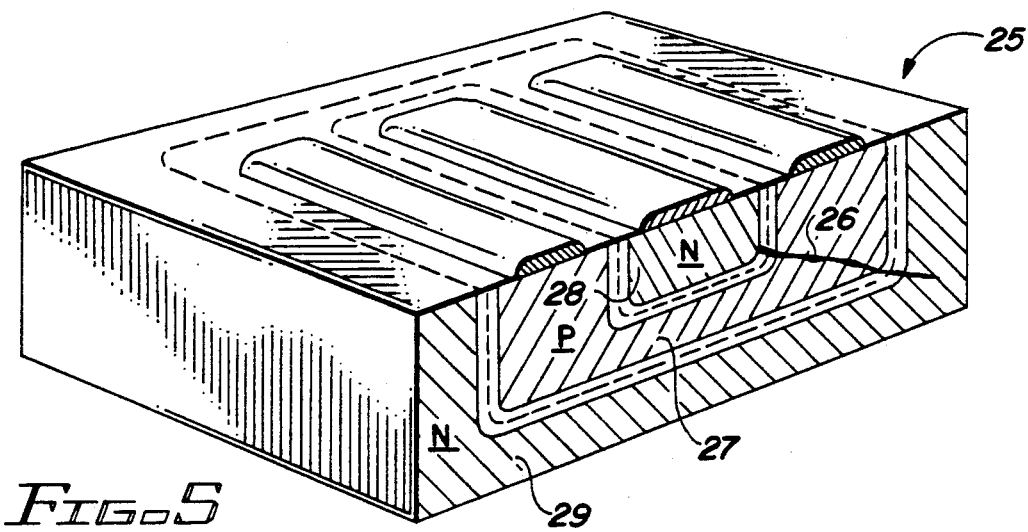
FIG. 5 is a simplified representation of an integrated circuit NPN transistor having an exemplary N+ pipe fault.
Figure 6:
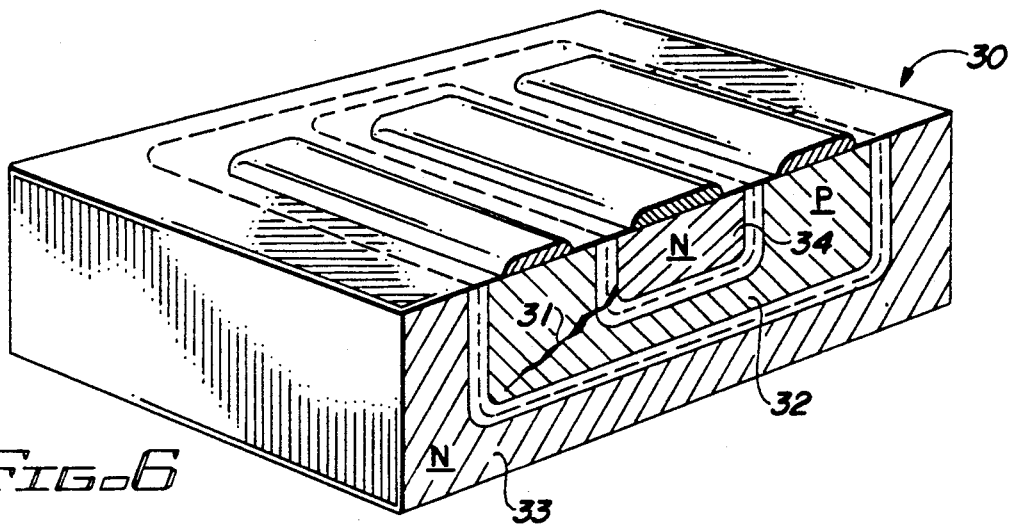
FIG. 6 is a simplified representation of an integrated circuit NPN transistor having an exemplary N+ spike fault.

Attention is now directed to FIG. 5 which illustrates a typical N+ pipe condition in a transistor 25 which might be the transistor in the difference amplifier biased by $V_{ref}$ in a logic element of a CML integrated circuit contained within a micropack. (I.e., the transistor 25 in the example is one of many reference biased transistors in an integrated circuit, many of which integrated circuits are enclosed within the sealed micropack.) More particularly, it will be seen that a pipe 26 extends completely through the base 27 from the emitter 28 to the collector 29 of the transistor. Similarly, as shown in FIG. 6, there is a typical N+ spike condition in a transistor 30 in which a spike 31 extends partly through the base 32 toward the collector 33 from the emitter 34. (The spike might also extend into the base region from the collector.)

Consider the local effects of these faults (which may well escape detection in the testing of the individual integrated circuit to be incorporated into a micropackage). In general, any such fault will increase the number of recombination sites which decreases minority carrier lifetime. As a result, recombination current in the base region increases which increases base current leading to a decrease in $\beta$ (i.e., current gain: $I_c/I_b$). Consequently, the transistor having the fault (and therefore the integrated circuit incorporating the transistor with the fault) is statistically less reliable even though the integrated circuit may have passed individual quality control tests. If a micropack contains one or more integrated circuits having reference biased transistors with faults, it is also statistically less reliable to an extent dependent upon the number of such "faulty" integrated circuits.

This decrease in $\beta$, if present in enough reference biased transistors in a micropack, leads to a small, but measurable, increase in the micropack $I_{ref}$ if $I_o$ is constrained to be substantially constant (as it is in CML and ECL).

Other, related, subtle deleterious effects may arise as a result of the presence of N+ diffusion faults in the reference biased transistors within a micropack. Such faults, due to an effect similar to a field effect transistor, could cause a variation in base-to-emitter voltage which results in a small increase of $I_o$ when the reference biased transistor is conducting. Another possible effect is the effective extension of a spike, which is nearly a pipe, by increased reverse bias (collector-to-base) stress which increases the depletion layer to bring about contact of the spike at a new collector "edge".

Consider now the process for determining if a micropack is statistically "risky". Each micropack is first subjected to standard d-c and a-c quality control tests, and only those micropacks which pass these tests enter the "good"/"risky" phase of testing according to the invention. The $I_{ref}$ (reference voltage current) of each like micropack (i.e., one of a group of logically identical micropacks) is closely measured with the $V_{ref}$ supplied being very carefully regulated to the same voltage. These results are then plotted (or otherwise prepared for statistical analysis) to obtain a basis for making the decisions. Then, an $I_{ref}$ threshold is established on the high side. This threshold for classification as "risky" may first simply be set by intuition and, in fact, in one approach to be discussed below, may be preliminarily established sufficiently high as to include even the micropack with the highest observed $I_{ref}$ if the already-performed basic quality control tests are sufficiently stringent.

Classification as "risky" at this stage does not necessarily disqualify a given micropack as unusable, partly because the degree of risk can only be roughly quantified by the position of the micropack in the distribution curve. However, further analysis can be undertaken with a view to refining the threshold position for a given type of micropack. While selected micropacks with the highest apparent risk can, of course, be de-lidded for further investigation, a particularly effective procedure for meaningfully improving the placement of the "risky" threshold is to pass all or almost all the micropacks during the early phase of analyzing the reliability of a given micropack. Further, the computer systems into which the micropacks are incorporated may themselves be subject to classifications of requisite reliability (although it is usually an important goal that all large systems be extremely reliable) and consequent appropriate assignment of micropack sets.

The reliability of the micropacks may thus be assessed in actual operation over a period of time. If a given micropack (all micropacks are identified by serial number or the equivalent) fails or is observed to be subject to intermittent problems, its individual position in the distribution curve for its micropack type is considered. If, over a period of time, it becomes apparent that an improvement in micropack reliability can be obtained by lowering the $I_{ref}$ threshold for classification as "risky" for one or more classes of computer, this step can be undertaken.

Figure 7:
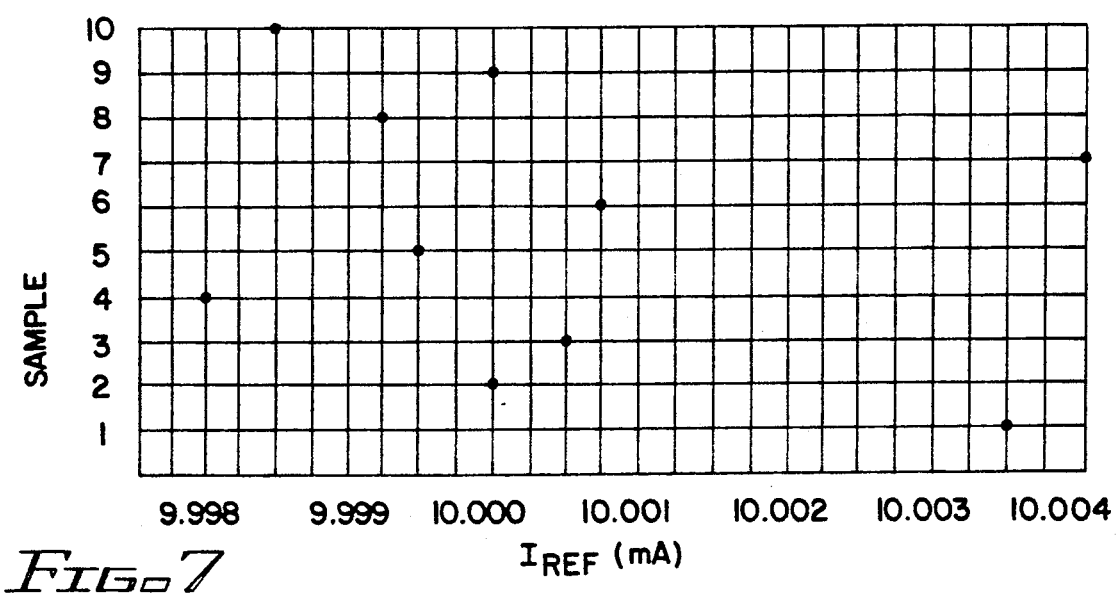
FIG. 7 is a graph illustrating a statistical distribution of individual total $I_{ref}$ in a group of tested, like, micropacks and which may be employed in the "good"/"risky" decision process.

Referring to FIG. 7, an exemplary distribution curve for ten micropacks of a given type is presented. (It will be understood, of course, that a much larger number of samples would be employed in an actual testing regimen.) The samples are grouped around an $I_{ref}$ value of about 10.000 mA and extend from 9.998 mA to 10.004 mA, and it is clear that the samples situated at 10.003+ mA and 10.004 mA are somewhat removed on the high side from the remainder of the samples. The first threshold might be established at 10.003 mA with the two samples exceeding this threshold de-lidded or, alternatively, still used, but in a less critical computer system. As another alternative, the data may simply be retained and all samples passed for use in any application; i.e., the first threshold established just above 10.004 mA in the example.

Subsequently, as information becomes available about actual hard or intermittent failure (or even suspected failure) in actual use, this information may folded back into the original data to refine the threshold of risk. For example, suppose both the samples above the original "intuitive" threshold should fail and also the sample originally measured with an $I_{ref}$ of 10.002+. This would be a good indication that the original threshold was set too high and that it should be lowered from 10.003 to, say, 10.002.

Conversely, suppose only one of the samples measured with an $I_{ref}=10.000+$ failed over a significant period of time. This would be a good indication that the original threshold was set too low and should be raised to, 10.005.

This is, of course, an iterative process through which the position of the threshold can be further refined as more micropacks are incorporated into the database and more field information is obtained. When the threshold is fully established with a reasonable degree of confidence, the rejection of "risky" micropacks (or their assignment to less sensitive computer systems) inevitably results in a significant reduction in failures from the extremely subtle source discussed above.

Thus, while the principles of the invention have now been made clear in an illustrative embodiment, there will be immediately obvious to those skilled in the art many modifications of structure, arrangements, proportions, the elements, materials, and components, used in the practice of the invention which are particularly adapted for specific environments and operating requirements without departing from those principles.

What is claimed is:

1. A process for grading the reliability of micropackages containing a plurality of integrated circuits energized by $V_{cc}$ power, at least some of which integrated circuits include current mode logic elements, each logic element including a pair of transistor amplifiers configured as a difference amplifieer, one of the transistor amplifiers of the pair being biased by a regulated reference voltage applied to its base electrode, the process comprising the steps of:

A) separating the micropackages into groups such that the micropackages in each group are logically identical;

B) measuring the current flowing at the reference voltage in each micropackage in a selected group to determine a reference current value therefor;

C) arranging the results of step B) for statistical analysis;

D) making a threshold determination of an acceptable reference voltage current for the micropackages in the selected group; and E) classifying as "risky" those micropackages in the group having a reference current value above the threshold.

2. The process of claim 1 which includes the subsequent steps of:

F) observing the failure of any micropackages in the selected group during normal operation;

G) correlating a failure which may have been observed in step D) to the reference current value of the failed micropackage determined in step B); and H) returning to step D).

3. The process of claim 2 in which the initial threshold determination established in step D) is placed immediately above the highest reference current value observed in the selected group.

4. The process of claim 2 in which later fabricated micropackages in the selected group are entered into the process at step A).

5. The process of claim 3 in which later fabricated micropackages in the selected group are entered into the process at step A).

* * * * *